United States Patent [19]

Petry, Jr. et al.

[11] Patent Number: 4,949,159
[45] Date of Patent: Aug. 14, 1990

[54] CARRIER FOR FILM-MOUNTED INTEGRATED CIRCUIT

[75] Inventors: Chester H. Petry, Jr., Tigard, Oreg.; Jon C. Houghton, Auburn, Wash.

[73] Assignee: Byers Photo Equipment Company, Portland, Oreg.

[21] Appl. No.: 228,365

[22] Filed: Aug. 3, 1988

[51] Int. Cl.$^5$ .................... H01L 23/48; H01L 29/46; H01L 29/54
[52] U.S. Cl. ........................ 357/70; 357/74; 357/69
[58] Field of Search ............... 357/70, 72, 74, 69; 174/52.4; 428/13, 120

[56] References Cited

U.S. PATENT DOCUMENTS

| 4,007,479 | 2/1977 | Kowalski | 357/70 |
| 4,012,768 | 3/1977 | Kirk et al. | 357/70 |
| 4,068,767 | 1/1978 | Tippetts | 214/6 BA |
| 4,069,496 | 1/1978 | Kowalski | 357/70 |
| 4,547,794 | 10/1985 | Tang | 357/70 |
| 4,600,611 | 7/1986 | Clark | 357/70 |
| 4,696,526 | 9/1987 | Newton et al. | 439/68 |

OTHER PUBLICATIONS

Photocopies of an AMS Carrier (1987–88).

Primary Examiner—Rolf Hille
Assistant Examiner—Hoanganh Le
Attorney, Agent, or Firm—Marger & Johnson, Inc.

[57] ABSTRACT

A carrier for film-mounted integrated circuits comprises a body member having a rectangular cavity for receiving a segment of a flexible film strip and a retainer member shaped and sized to fit conformably within the cavity, each integrally molded of a resilient polymeric material. A series of undercut ledges are spaced along the interior periphery of the cavity and complementary lips are spaced along the exterior periphery of the retainer member and protruding from the outer edge faces thereof in juxtaposition with the undercut ledges for interengaging therewith. The lips and ledges interlock the retainer member within the body member in nested relationship with a margin of said rectangular segment sandwiched between the flat bottom wall and flat bottom face of the body and retainer members. The undercut ledges and complementary lips are spaced depthwise of the cavity so as to provide a space between the bottom wall and the bottom face of a width no greater than the thickness of the film strip for compressingly retaining the margin of the segment.

36 Claims, 2 Drawing Sheets

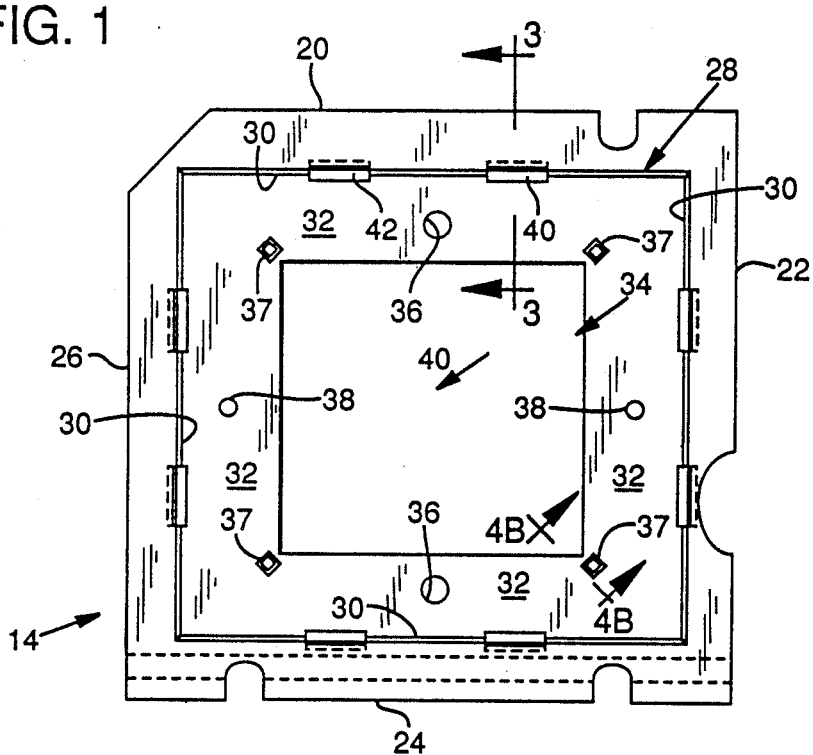

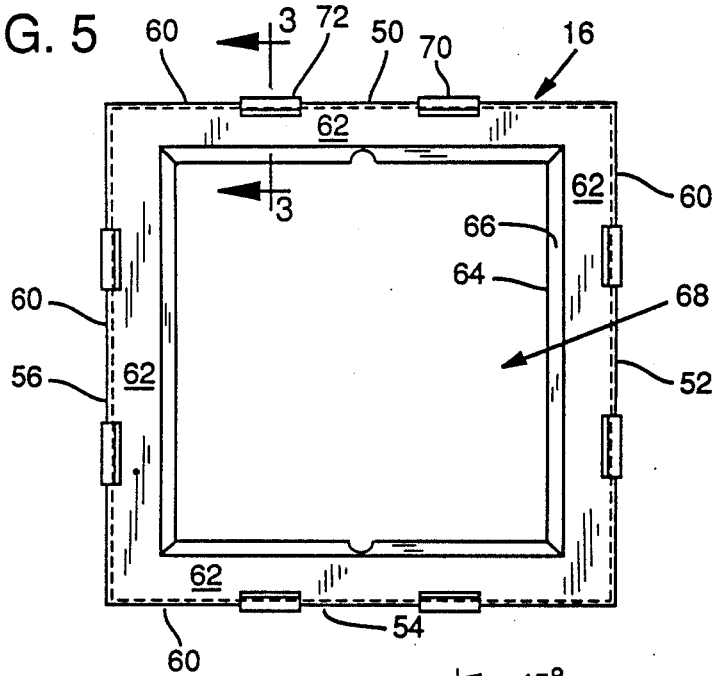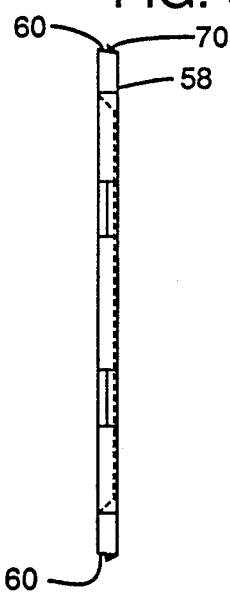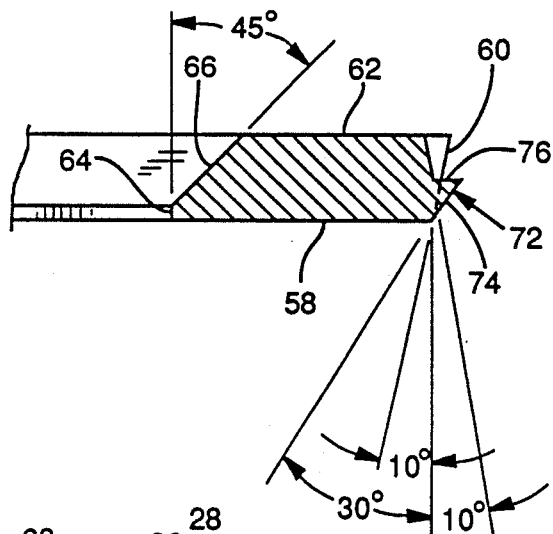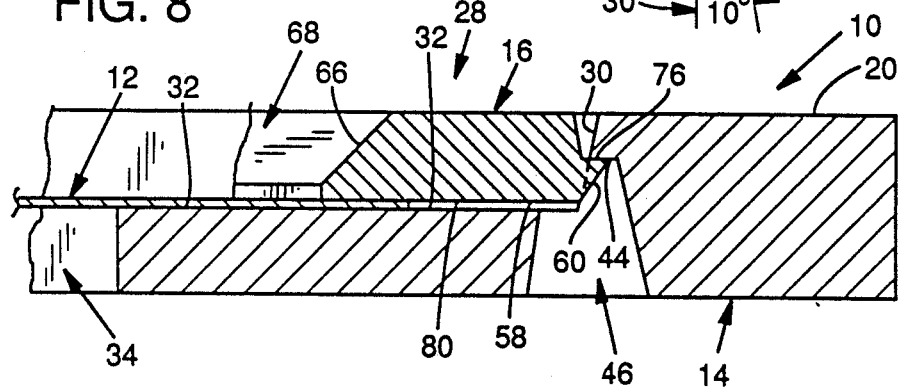

CARRIER FOR FILM-MOUNTED INTEGRATED CIRCUIT

BACKGROUND OF THE INVENTION

This invention relates to automated manufacture of integrated circuits and more particularly to a carrier for use in tape-assisted bonding (TAB) of an integrated circuit chip onto a segment of a strip of flexible film material on which an array of flexible, conductive beam leads have been formed.

U.S. Pat. Nos. 4,007,479 and 4,069,496 to Kowalski generally describe the prior art techniques for tape-assisted bonding. Each of these patents discloses a different form of carrier in which a segment of a film strip is mounted for subsequent processing after the segment has been detached from a continuous strip of such segments.

Kowalski '479 discloses a fixture or carrier in the form of upper and lower layers, each in the form of a rectangular frame member, interconnected along one side of each of the frame members by a hinge. The frame members and hinge structure are integrally formed of plastic by injection molding. One of the layers has a rectangular cavity for receiving the segment of film strip. The cavity is formed to closely match the dimensions of the film strip. Lugs are formed in opposite lateral sides of the cavity for fitting into sprocket holes in the film strip. The frame members have openings to expose the film strip on both sides. The frame members are fastened together in overlying relationship by means of opposed concentric rings on the opposed faces of the upper and lower layers. The rings are arranged and sized to frictionally engage when nested together.

Kowalski '496 recognized that the design in the '479 patent had a number of problems and deficiencies. The '496 patent discloses a carrier or fixture composed of a single frame member having a rectangular cavity and specially formed lugs which insert through sprocket holes in the film segment. The lugs have overlapping lateral projections which are intended to retain the film segment in the carrier.

U.S. Pat. No. 4,547,794 to Tang also discloses a carrier and discusses the problems noted by Kowalski but which Tang deemed to remain unsolved. Tang proposes a carrier composed of a single frame member with a rectangular cavity for retaining a film segment. Formed integrally in the sides of the frame member are a plurality of enlongated cantilevered beam members which are movable from a first position to a second position for insertion and removal of the film segment in the cavity. These beam members are integrally formed with the frame members by plastic injection molding.

Another form of carrier is supplied commercially by AMS to Digital Equipment Corp. This carrier also is composed of a single frame member having a rectangular cavity for receiving a film strip segment. This carrier differs somewhat from the above-described carriers in that it does not have lugs for insertion into the film sprocket holes. Instead, it has diagonally-oriented square lugs positioned for insertion into special positioning holes located at the four corners of each segment just inward of the sprocket holes. This arrangement is in accordance with a set of standards known as the JEDEC Standards, adopted by a group of U.S. integrated circuit manufacturers. The film segment is secured in each mount by means of four small plastic pins which are frictionally inserted into four holes in the bottom wall of the cavity of the frame member at each corner of the segment The holes are positioned in the bottom wall of the carrier so as to align with the sprocket holes in each corner of the film segment. The pins are sized to an interference fit with the holes and have a cap which overlaps the film around each sprocket hole.

From a review of the foregoing patents, it is apparent that there is a need for a reliable method and form of carrier for mounting segments of flexible film strips or tape-assisted bonding of integrated circuits. Meeting this objective entails solving a number of rather difficult problems unique to handling integrated circuits. Moreover, the problems become increasingly difficult as the circuitry gets more complex. The examples of film segments in the Kowalski patents show circuit connections on which 40 beam leads have been formed, 10 per side. Current integrated circuit technology often calls for circuits having hundreds of beam leads. This means the beam leads must be narrower and closer together (i.e. narrower pitch) by nearly an order of magnitude compared to those shown in Kowalski. Lateral alignment is critical to ensure bonding of the beam leads to the correct locations on the integrated circuit chips.

Retaining alignment uniformly throughout each step of the process and from one carrier to the next is critical to automated processing. The film strip segments must be securely held in place for various processing steps while providing access to the beam leads for testing the connections and circuit but permit easy placement of the segment in the carrier and removal of it from the carrier after processing. The design of the carrier should permit all processing steps to be performed mechanically in a fully automated process, with a high degree of reliability.

Prior carriers do not meet these requirements sufficiently for state-of-the-art integrated circuits. Accordingly, a need remains for an improved carrier.

SUMMARY OF THE INVENTION

It is therefore an object of the invention to provide a carrier that will securely hold a segment of a flexible film strip patterned with many narrow beam leads in a predetermined position for various stages of processing including testing.

Another object is to provide a carrier that enables easy placement and removal of a film segment, without risk of inadvertent separation of the segment from the carrier.

A further object is to make it easy to test the beam leads and/or an integrated circuit bonded to the beam leads while the segment of film strip is mounted in the carrier.

The invention provides a carrier for film-mounted integrated circuits comprising a body member having a rectangular cavity for receiving a segment of a flexible film strip, a retainer member shaped and sized to fit conformably within the cavity, and complementary interengagement means along the interior periphery of the cavity and outer periphery of the retainer member. The interengagement means serve to interlock the retainer member within the body member in nested relationship with a margin of said rectangular segment sandwiched between the flat bottom wall and flat bottom face, respectively, of the body and retainer members.

The interengagement means is preferably formed by a series of undercut ledges spaced along the interior periphery of the cavity and complementary lips spaced along the exterior periphery of the retainer member and protruding from the outer edge faces thereof in juxtaposition with the undercut ledges for interengaging therewith. The undercut ledges and complementary lips are spaced depthwise of the cavity so as to provide a space between the bottom wall and the bottom face of a width no greater than the thickness of the film strip for compressingly retaining the margin of the segment. The body member including the undercut ledge and the retainer member including the complementary lips are each integrally molded of a resilient polymeric material. The sidewalls of the cavity in the body member and the edge faces are beveled at complementary angles so as to fit conformably but noninterferingly together when assembled with the segment.

The cavity and retainer member are preferably sized to a length and width that exceed the length and width, respectively, of the segment by a predetermined margin such that the retainer member can resiliently compress the margin of the segment when interlocked within the body member. The body member can have an opening sized to a rectangular length and width less than the length and width of the segment. The retainer member preferably includes a central window for exposing a central portion of an upper side of the segment of film strip opposite the opening. The window is sized to a length and width less than the length and width of the segment and greater than the length and width of the opening so that a marginal portion of the segment and beam leads are exposed and supported atop a marginal portion of the bottom wall. The window sidewall is beveled to make it easy for a test probe to be inserted at a downward angle against the supported marginal portion of the segment to contact the beam leads.

Preferably, each undercut ledge is defined by a portion of the sidewall of the cavity and a bottom of a core hole of predetermined depth, width and length extending through the body member from a bottom side thereof to form a corner at a first spacing from the bottom wall of the cavity. Correspondingly, each of the complementary lips is defined by a wedge-shaped protrusion from the exterior periphery of the retainer member having a beveled face inclined to form an obtuse angle with the bottom face of the retainer member and an acute angle corner at a second spacing from the bottom surface. The first and second spacings have a difference no greater than the thickness of the segment of flexible film.

The foregoing and other objects, features and advantages of the invention will become more readily apparent from the following detailed description of a preferred embodiment which proceeds with reference to the drawings.

BRIEF DESCRIPTION OF THE DRAWINGS

FIG. 1 is a top plan view of the body member of a carrier according to the invention.

FIG. 2 is a side elevational view of the carrier of FIG. 1, interior detail being shown in dashed lines.

FIG. 3 is an enlarged cross-sectional view taken along lines A—A in FIG. 1.

FIG. 4A and 4B are enlarged top plan view and side elevational view of the segment alignment lugs used in the body member of FIG. 1.

FIG. 5 is a top plan view of the retainer member employed in the carrier of the present invention, by insertion into the cavity of the body member of FIG. 1.

FIG. 6 is a side elevational view of the retainer member of FIG. 5, interior details being shown in dashed lines.

FIG. 7 is an enlarged cross-sectional view taken along lines A—A in FIG. 5.

FIG. 8 is an enlarged cross-sectional view similar to FIGS. 3 and 7 showing the carrier of FIGS. 1 and 5 assembled with a segment of flexible film strip sandwiched between the body and retainer members.

DETAILED DESCRIPTION

General Arrangement

Referring to FIGS. 1, 5 and 8, a carrier 10 for mounting a segment 12 of a flexible film strip or TAB tape includes a body member 14 (FIGS. 1–3) and a retainer member 16 (FIGS. 5–7).

The general structure of segment 12 is disclosed, with an integrated circuit chip bonded to the beam leads thereof, in U.S. Pat. No. 4,069,496. The structure of the segment used in the preferred embodiment disclosed herein can be much more complex, however, with hundreds of beam leads. It is modified in accordance with JEDEC standards, to provide alignment pins in each corner of the beam lead metallization pattern, as will be made more clear in the following description of the alignment pins shown in FIGS. 4A and 4B.

A specific example of carrier 10 is shown in the drawing figures with dimensions in inches. This example is designed for use with a rectangular film segment 12 measuring 1.309" long by 1.376" wide and having a film thickness of 0.005–0.007". All of the foregoing dimensions are provided solely to disclose an operative example of a carrier embodying the present invention and are not intended to limit the scope of the invention. Those skilled in the art will readily perceive that the principles of the invention can be applied to film segments of different dimensions. The body member 14 is, additionally, based on the abovementioned AMS carrier to provide compatibility with conventional handling equipment. Accordingly, the external dimensions and geometry of body member 14 are conventional and need not be further described.

The body member 14 and retainer member 16 are formed by injection molding of a static-resistant, glass and carbon-filled plastic or other suitable polymeric material. The preferred material is AKZO J-1300/30/CF/5/Natural. This material is used in the aforementioned ASM carrier. Following, in Table 1, is a list of the properties of this material, of which the mechanical properties of flexural strength and modulus and ability to retain shape under stress and at high temperatures, are important to carrying out the present invention. Other polymeric materials are known which will also meet the requirements of the present invention.

TABLE 1

| AKZO J-1300/30/CF/5/Natural Exemplary Property Data | | | |
|---|---|---|---|
| | Units | ASTM Test | Values |
| Mechanical Properties | | | |
| Tensile Strength | psi | D638 | 20,400 |
| Elongation | % | D638 | 1.1 |
| Tensile Modulus | psi × 10$^5$ | D638 | 22.6 |

TABLE 1-continued

AKZO J-1300/30/CF/5/Natural
Exemplary Property Data

| | Units | ASTM Test | Values |
|---|---|---|---|
| Flexural Strength | psi | D790 | 27,100 |
| Flexural Modulus | psi × 10⁵ | D790 | 21.3 |
| Izod Impact Strength ⅛" | ft-lbs/in | D255 | 1.2 |
| Physical Properties | | | |
| Water Absorption in 24 hrs. | % | D570 | 0.20 |
| Linear Mold Shrinkage | | | |
| ⅛" | in/in | — | .0001 |
| ⅜" | in/in | — | .0005 |
| Deflection Temperature | | | |
| Under Load @ 66 psi | °F. | D648 | >500 |
| Under Load @ 264 psi | °F. | D648 | >500 |
| Specific Gravity | — | D792 | 1.95 |
| Thermal Properties | | | |
| Surface Resistivity | ohm/sq | D257 | 2.7 × 10⁵ |

Body Member Configuration

Referring now to FIGS. 1, 2 and 3, the body member 14 comprises a first rectilinear frame formed by four side or frame members 20, 22, 24, 26. The body member has smooth, flat top and bottom surfaces. The external periphery of these side members include various cutouts, notches and grooves which are conventional and will not further described.

A rectangular cavity, indicated generally by reference numeral 28, is formed within the frame members 20–26. It has a rectangular interior periphery defined by sidewalls 30 on each of the frame members 20–26 and a flat bottom wall 32 integrally connected to each of the side members 20–26. A rectangular central opening 34, sized to expose a central portion of a lower side of the segment 12 of flexible film strip, is centered on the bottom wall 32. A pair of alignment holes 36 are conventionally formed in the bottom wall, centered along opposite side members 20, 24 for alignment with sprocket holes in the sides of the film strip segment. Four square alignment pins 37 are positioned at the corners of the opening, in accordance with JEDEC standards. These pins are detailed in FIGS. 4A and 4B.

A pair of extraction holes 38 are formed in the bottom wall along the axis of the carrier, that is, centered along the frame side members 22, 24. These holes are provided in accordance with the invention to aid in removal of the retainer member 16 and segment 12 after processing.

Sidewalls 30 are beveled at an angle of 10° from a normal to the plane of bottom wall 32. A series of undercut ledges are spaced along the interior periphery of the cavity of the body member and spaced depthwise from the bottom wall of the cavity in sidewalls 30. In the particular example of the carrier shown in the drawings, two such ledges 40, 42 are formed in the sidewall 20, 22, 24, 26 of each side frame member. Fewer or more such ledges and complementary lips (described below) can be used in smaller or larger carriers The structure of ledge 40, shown in FIG. 3, is typical of all of the ledge members. The ledge is formed by a bottom 44 of a core hole 46 that extends upward from the bottom side 48 of the body member toward the top side thereof along a normal to the plane of bottom wall 32. It is aligned such that the axis of the core hole intersects inclined wall 30 at the intersection of wall 30 and wall 32. Ledge 40 is thus formed with an 80° acute angle corner. The length of the core hole is elongated relative to its width, as shown in FIG. 1. The depth of the core hole bottom 44 is carefully set relative to the elevation of bottom wall 32 and the thickness of film segment 12 and retainer 16, as further described below.

Retainer Member Configuration

Referring to FIGS. 5–7, the retainer member 16 is similarly formed as a second rectilinear frame defined by side frame members 50, 52, 54, 56 arranged to provide a rectangular exterior periphery. The periphery of the retainer member is defined by outer edge faces 60 shaped and sized to fit conformably within the rectangular sidewalls 30 of the cavity 28. As shown in FIG. 7, the edge faces 60 are beveled at a 10° angle from a normal to the flat bottom face 58 of retainer member 16 so as to form a 100° obtuse angle between faces 58, 60. The retainer member has a flat bottom face 58 and a flat top face 62 positoned to align flushly with the top face of the body member.

Complementary to the undercut ledges in the sidewall of the body member, a series of lips are spaced along the exterior periphery of the retainer member. In the example of carrier shown in the drawings, two such lips 70, 72 are formed in each side 50, 52, 54, 56 of the retainer member. Lip 72 shown in FIG. 7 is typical of all the lips.

These lips are positioned along the sides of the retainer member so as to protrude from the outer edge faces in juxtaposition with the undercut ledges of the body member for engaging therewith to interlock the retainer member with the body member in nested relationship. In this relationship, shown in FIG. 8, a margin of the rectangular segment 12 is sandwiched between the flat bottom wall 32 and the flat bottom face 58, respectively, of the body and retainer members. The lips 70, 72 are spaced depthwise from the bottom of the cavity so as to provide a space 80 between the bottom wall and the bottom face of the retainer member having a width no greater than the thickness of the film strip for compressingly retaining the margin of the segment 12. The film strip typically has a thickness that ranges between a minimum and a maximum, for example, 0.005–0.007 inch in the example shown, so the space 80 is sized to a width substantially equal to the minimum thickness.

Referring to FIG. 7, each lip 70, 72 defined by a wedge-shaped protrusion from it respective edge face 60, having a beveled face 74 inclined to form an obtuse angle of about 120° from a normal to bottom face 58. The wedge-shaped protrusion also has a top face 76 that is essentially parallel to bottom face 58. Thus, the face 74 and face 76 form the wedge-shaped protrusion at an angle of about 60°. When the retainer member is nested within the cavity of the bottom member, the complementary lips 70, 72 interlock beneath the ledges 40, 42 of the body member, face 76 of the lip engaging against bottom face 44 of the ledge.

As mentioned above, face 44 is spaced at a predetermined spacing from the bottom wall 32 of the body member. Similarly, face 76 is spaced at a predetermined second spacing from the bottom face of the retainer member. These two spacings are predetermined so as to have a difference no greater than the thickness of the segment of flexible film, preferably a thickness equal to the minimum dimension in the range of thickness of the film.

The retainer member top face 62 includes a interior sidewall 64, 66 defining a rectangular window 68 in the retainer member. The side frame members 50-56 are sized to a width such that the window is larger than opening 34 in the body member. Face 66 of the retainer member is beveled, or example, at a 45° angle (135° from the plane of strip 12). This arrangement provides a marginal area of the segment, upon which rectangular contact pads are formed, that is both supported from the underside by the bottom wall 32 and exposed on the upper side of the film segment for contact by test probes to test the beam leads and/or an integrated circuit bonded thereto.

The cavity is sized to a length and width that is larger than the length and width of the film segment 12 by a margin such that only the innermost approximately one-third of the retainer member contacts the top surface of segment 12. In other words, space 80 underlies a substantial portion of retainer member 16 outside of the perimeter of the film segment 12. This enables the retainer member to flex slightly to resiliently compress the margin of the film segment when interlocked within the body member. Additionally, the retainer member is dimensioned so that the length and width along the edge faces 60 match the length and width of cavity 28 along the sidewalls 30. Since the edge faces and sidewalls are beveled at an angle of 10° from the normal to the bottom wall 32 and bottom face 58, the thickness of the film segment 12 spaces the side and edge faces 60, 30 very slightly apart so that they noninterferingly interfit. This slight space allows the edges of the retainer body to flex downward to permit the lips to pass beneath the ledges when the retainer is inserted into the cavity. Once inserted, the retainer member fits conformably within the cavity but without frictional engagement of the edge faces 60 against the side faces 30 of the cavity. Consequently, the retainer member is resiliently interlocked in the body member solely by the interengagement of the ledges and complementary lips.

The retainer member is easily removed by placing the assembled carrier over a pair of vertical pins spaced apart and sized to align with extraction holes 38 in the body member 14. By lowering the assembled carrier or raising the pins, the ends of the pins protrude through holes 38 to contact the bottom face 58 of the retainer member equidistantly between the sets of interengagement means on opposite sides of the carrier. The retainer member can thereby be ejected from the cavity by forces applied equally to the pins, with the complementary lips disengaging uniformly from the ledges in the body member. The noninterference fit of the retainer member in the cavity avoids a frictional engagement of the two members that might otherwise laterally skew the forces needed to extract the retainer member.

Having illustrated and described the principles of our invention in a preferred embodiment thereof, it should be readily apparent to those skilled in the art that the invention can be modified in arrangement and detail without departing from such principles. We claim all modifications coming within the spirit and scope of the accompanying claims.

We claim:

1. A carrier for film-mounted integrated circuits, comprising:
    a body member defining a first rectilinear frame having a cavity with a bottom wall and a rectangular interior periphery defined by sidewalls for receiving a rectangular segment of a flexible film strip and a central opening in the bottom wall sized to expose a central portion of a lower side of the segment;
    a retainer member defining a second rectilinear frame having a rectangular exterior periphery defined by outer edge faces shaped and sized to fit conformably within the rectangular sidewalls of the cavity; and
    complementary interengagement means spaced along the sidewalls of the interior periphery of the cavity in the first frame and the edge faces of the exterior periphery of the second frame for laterally interlocking the retainer member within the body member in nested relationship with a margin of said rectangular segment sandwiched immovably between said members.

2. A carrier according to claim 1 in which each of the rectangular interior and exterior peripheries includes said lateral interengaging means so as to interlock the retainer member in the body member on four sides.

3. A carrier according to claim 1 in which each side of the rectangular interior and exterior peripheries includes two of said interengaging means symmetrically positioned about a midpoint of each side.

4. A carrier according to claim 1 including a pair of holes in the bottom wall of the body member, the holes being positioned on opposite sides of the central opening and centered between the interengagement means so that a pair of extraction pins can be inserted into such holes into contact with the bottom face of the retainer member to uniformly apply an extraction force thereto for disengaging the interengagement means to eject the retainer member from the cavity.

5. A carrier according to claim 1 in which the retainer member includes a central window that is larger than the central opening in the body member so that a portion of said rectangular strip extending along the margin thereof is supported on one side by the bottom wall of the cavity.

6. A carrier for film-mounted integrated circuits, comprising:
    a body member defining a first rectilinear frame having a cavity with a rectangular interior periphery defined by sidewalls for receiving a rectangular segment of a flexible film strip and a central opening sized to expose a central portion of a lower side of the segment;
    a retainer member defining a second rectilinear frame having a central window for exposing a central portion of an upper side of the segment and a rectangular exterior periphery defined by outer edges shaped and sized to fit conformably within the rectangular sidewalls of the cavity; and
    complementary interengagement means spaced along the side-walls of the interior periphery of the cavity in the first frame and the edge faces of the exterior periphery of the second frame for laterally interlocking the retainer member within the body member in nested relationship with a margin of said rectangular segment sandwiched immovably between said members,
    the cavity having a flat bottom wall defining a depth of the cavity and the retainer member having a flat bottom face arranged for contacting opposite sides of the segment of the film strip, the film strip having a predetermined thickness and the interengagement means being spaced depthwise of the cavity so as to provide a space between the bottom wall and the bottom face of a width no greater than the thickness of the film strip for compressingly retaining the margin of the segment.

7. A carrier according to claim 6, in which the film strip thickness is within a minimum and maximum thickness and the space has a width substantially equal to said minimum thickness.

8. A carrier according to claim 6 in which the bottom wall includes a pair of holes positioned on opposite sides of the central window so that a pair of extraction pins can be inserted into the holes and urged against a bottom face of the retainer member to urge the retainer member out of the cavity, the interengagement means being arranged to disengage when the retainer member is so urged.

9. A carrier according to claim 6, in which the sidewall of the cavity in the body member and the edge faces of the retainer member are beveled at complementary obtuse angles so as to fit conformably but noninterferingly together when the retainer member is interlocked into the cavity of the body member with said segment sandwiched therebetween.

10. A carrier for film-mounted integrated circuits, comprising:
   a body member defining a first rectilinear frame having a cavity with a rectangular interior periphery defined by sidewalls for receiving a rectangular segment of a flexible film strip and a central opening sized to expose a central portion of a lower side of the segment;
   a retainer member defining a second rectilinear frame having a central window for exposing a central portion of an upper side of the segment and a rectangular exterior periphery defined by outer edges shaped and sized to fit conformably within the rectangular sidewalls of the cavity; and
   complementary interengagement means spaced along the side-walls of the interior periphery of the cavity in the first frame and the edge faces of the exterior periphery of the second frame for laterally interlocking the retainer member within the body member is nested relationship with a margin of said rectangular segment sandwiched immovably between said members,
   the film strip segment having a predetermined rectangular length and width, the cavity and retainer member being sized to a length and width that exceed the length and width, respectively, of the segment by a predetermined margin such that the retainer member can resiliently compress the margin of the segment when interlocked within the body member.

11. A carrier for film-mounted integrated circuits, comprising:
   a body member defining a first rectilinear frame having a cavity with a rectangular interior periphery defined by sidewalls for receiving a rectangular segment of a flexible film strip and a central opening sized to expose a central portion of a lower side of the segment;
   a retainer member defining a second rectilinear frame having a rectangular exterior periphery defined by outer edges shaped and sized to fit conformably within the rectangular sidewalls of the cavity; and
   complementary interengagement means spaced along the interior periphery of the cavity in the first frame and the exterior periphery of the second frame for interlocking the retainer member within the body member is nested relationship with a margin of said rectangular segment sandwiched immovably between said members,
   the retainer member including a window centrally located therein for exposing a central portion of an upper side of the segment of film strip opposite the opening in the body member, the window having a sidewall that is beveled at an obtuse angle such that a test probe can be inserted in a direction toward the center of the segment and downward for testing an integrated circuit or beam leads therefor mounted on the segment.

12. An assembly for handling film-mounted integrated circuits, comprising:
   a segment of a flexible film strip having beam leads formed thereon in a predetermined pattern for connection to an integrated circuit;
   a carrier body member having a cavity with an interior periphery defined by rectangular sidewalls and a flat bottom wall for receiving the segment and a central opening sized to expose a central portion of a lower side of the segment;
   a carrier retainer member having an exterior periphery defined by outer edge faces shaped and sized to fit conformably within the rectangular sidewalls of the cavity and a flat bottom face for pressing margins of the segment of flexible film strip against the flat bottom face of the carrier body member; and
   complementary interengagement means spaced along the sidewalls of the interior periphery of the cavity in the body member and the edge faces of the exterior periphery of the retainer member for laterally interlocking the retainer member within the body member in nested relationship with a margin of the segment of flexible film strip sandwiched immovably between said members.

13. An assembly according to claim 12, in which the retainer member includes a window centrally located therein exposing a central portion of an upper side of the segment of film strip opposite the opening in the body member, the window having a sidewall that is beveled downward toward the center of the segment such that a test probe can be inserted in a downward and inward direction from a side of the assembly for contacting said beam leads.

14. An assembly according to claim 12, in which the film strip segment has a predetermined rectangular length and width, the cavity and retainer member being sized to a length and width that exceed the length and width, respectively, of the segment by a predetermined margin such that the retainer member can resiliently compress the margin of the segment when interlocked within the body member.

15. An assembly according to claim 14, in which the body member and the retainer member, including said complementary interengagement means, are each integrally molded of a resilient polymeric material.

16. An assembly according to claim 12, in which:
   the film strip segment has a first rectangular length and width;
   the opening in the carrier body member is sized to a second rectangular length and width each less than the first length and width, respectively, by a predetermined margin;
   the retainer member includes a window centrally located therein exposing a central portion of an upper side of the segment of film strip opposite the opening in the body member; and the window is sized to a third rectangular length and width each less than the first length and width, respectively, and greater than the second length and width, respectively for exposing a portion of said beam leads supported atop the bottom wall.

17. A carrier for film-mounted integrated circuit, comprising:
- a body member defining a first rectilinear frame having a cavity with a rectangular interior periphery defined by sidewalls and a flat bottom wall for receiving a rectangular segment of a flexible film strip and a central opening sized to expose a central portion of a lower side of the segment;
- a retainer member defining a second rectilinear frame having a flat bottom face and a rectangular exterior periphery defined by outer edge face shaped and sized to fit conformably within the rectangular sidewalls of the cavity;
- a series of undercut ledges spaced along the sidewalls defining the interior periphery of the cavity of the body member and spaced depthwise from the bottom wall of the cavity in the sidewalls thereof; and
- complementary lips spaced along the outer edge faces defining the exterior periphery of the retainer member and protruding from the outer edge faces thereof in juxtaposition with the undercut ledges for interengaging therewith to interlock the retainer member within the body member in nested relationship with a margin of said rectangular segment sandwiched between the flat bottom wall and flat bottom face, respectively, of the body and retainer members.

18. A carrier according to claim 17, in which the film strip has a predetermined thickness and the undercut ledges and complementary lips are spaced depthwise of the cavity so as to provide a space between the bottom wall and the bottom face of a width no greater than the thickness of the film strip for compressingly retaining the margin of the segment.

19. A carrier according to claim 18, in which the film strip thickness is within a minimum and maximum thickness and the space has a width substantially equal to said minimum thickness.

20. A carrier according to claim 17, in which the body member including said undercut ledge and the retainer member including said complementary lips are each integrally molded of a resilient polymeric material.

21. A carrier according to claim 17, in which the sidewall of the cavity in the body member and the edge faces of the retainer member are beveled at complementary obtuse angles so as to fit conformably but noninterferingly together when the retainer member is interlocked into the cavity of the body member with said segment sandwiched therebetween.

22. A carrier according to claim 17, in which the film strip segment has a predetermined rectangular length and width, the cavity and retainer member being sized to a length and width that exceed the length and width, respectively, of the segment by a predetermined margin such that the retainer member can resiliently compress the margin of the segment when interlocked within the body member.

23. A carrier according to claim 17, wherein the film strip segment has a first rectangular length and width, in which:
- the opening in the body member is sized to a second rectangular length and width each less than the first length and width, respectively, by a predetermined margin;
- the retainer member includes a window centrally located therein exposing a central portion of an upper side of the segment of film strip opposite the opening in the body member; and
- the window is sized to a third rectangular length and width each less than the first length and width, respectively, and greater than the second length and width, respectively, so that a marginal portion of the segment and beam leads formed thereon are exposed and supported atop a marginal portion of the bottom wall.

24. A carrier according to claim 17, in which the window has a sidewall that is beveled at an obtuse angle such that a test probe can be inserted in a direction toward the center of the segment and downward against the supported marginal portion of the segment for contacting the exposed portions of the beam leads.

25. A carrier according to claim 17, in which each undercut ledge is defined by a portion of the sidewall of the cavity and a bottom of a core hole of predetermined depth, width and length, the core hole extending through the body member from a bottom side thereof to a depth such that the bottom thereof is spaced a predetermined distance above the bottom wall of the cavity and being positioned laterally relative to the sidewall such that the width of the core hole is approximately bisected by the sidewall.

26. A carrier according to claim 25, in which the sidewall of the cavity is beveled to form an acute angle corner at an intersection with the bottom of the core hole.

27. A carrier according to claim 17, in which each of the complementary lips is defined by a wedge-shaped protrusion from the exterior periphery of the retainer member having a beveled face inclined to form an obtuse angle with the bottom face of the retainer member and an acute angle corner at a predetermined spacing from the bottom surface.

28. A carrier according to claim 27, in which the edge face of the retainer member is beveled to form an obtuse angle corner at an intersection with the bottom face of the retainer member.

29. A carrier according to claim 17, in which:
- each undercut ledge is defined by a portion of the sidewall of the cavity and a bottom of a core hole of predetermined depth, width and length extending through the body member from a bottom side thereof to form a corner at a first spacing from the bottom wall of the cavity; and
- each of the complementary lips is defined by a wedge-shaped protrusion from the exterior periphery of the retainer member having a beveled face inclined to form an obtuse angle with the bottom face of the retainer member and an acute angle corner at a second spacing from the bottom surface;
- the first and second spacings having a difference no greater than the thickness of the segment of flexible film.

30. A carrier according to claim 17, in which:
- each undercut ledge is defined by a portion of the sidewall of the cavity and a bottom of a core hole of predetermined depth, width and length extending through the body member from a bottom side thereof to form a corner at a first spacing from the bottom wall of the cavity;

each of the complementary lips is defined by a wedge-shaped protrusion from the exterior periphery of the retainer member having a beveled face inclined to form an obtuse angle with the bottom face of the retainer member and an acute angle corner at a second spacing from the bottom surface;

the sidewall of the cavity is beveled to form an acute angle corner at an intersection with the bottom of the core hole and an obtuse angle at an upper face of the body member; and the edge face of the retainer member is beveled to form an obtuse angle corner at an intersection with the bottom face of the retainer member.

31. A carrier according to claim 17 in which the sidewalls of the cavity in the bottom member and edge faces of the retainer member are parallel and bevelled so as to form opposing obtuse angles for guiding the retainer member into the cavity and the undercut ledge and complementary lip are positioned such that, when interengaged with a segment of the flexible film strip between said body and retainer members, the sidewall and edge face are in opposed noninterfering relationship.

32. A carrier according to claim 17 in which said series of undercut ledges and complementary lips are spaced around the peripheries of the body and retainer members so as to compress the margin of the segment substantially uniformly all the way around.

33. A carrier according to claim 11 in which the flexible film strip includes a series sprocket holes along two opposite margins thereof, said body member including:

means for aligning the sprocket holes of the segment of flexible film strip along first and second opposite sides of the cavity;

a first pair of holes in the bottom wall centered on said first and second sides of the central opening in position to align with one sprocket hole on each side of the segment; and a second pair of holes in the bottom wall on third and fourth opposite sides of the central opening, centered relative to the alignment means to as to align with a centerline of the segment;

the undercut ledges and complementary lips being symmetrically positioned about said second pair of holes so that a pair of extraction pins can be inserted into such holes to contact the bottom face of the retainer member, whereby an extraction force can be uniformly applied to disengage the complementary lips from the undercut ledges to eject the retainer member and segment from the cavity.

34. A carrier for film-mounted integrated circuits, comprising a unitary body member and a unitary retainer member;

the body member defining a first rectilinear frame having a cavity with a flat bottom wall, a rectangular interior periphery defined by sidewalls for receiving a rectangular segment of a flexible film strip and a central opening in the bottom wall sized to expose a central portion of a lower side of the segment; and the retainer member defining a second rectilinear frame having a rectangular exterior periphery defined by outer edge faces shaped and sized to fit conformably within the rectangular sidewalls of the cavity;

the body member and retainer member including complementary interengagement means spaced along the sidewalls of the cavity in the first frame and the edge faces of the second frame for laterally interlocking the retainer member within the body member in nested relationship with a margin of said rectangular segment sandwiched between said members; and the retainer member including a central window sized larger than the central opening in the body member to expose the central portion of the segment along an upper side thereof, and to expose a test-pad portion of the segment planarly supported on the bottom wall along the margin of the segment so that the test pad portion can be contacted by test probes extended through the window.

35. An assembly for handling film-mounted integrated circuits, comprising:

a segment of a flexible film strip having beam leads formed thereon in a predetermined pattern for connection to an integrated circuit;

a carrier body member having a cavity with an interior periphery defined by rectangular sidewalls and a flat bottom wall for receiving the segment and a central opening sized to expose a central portion of a lower side of the segment;

a carrier retainer member having an exterior periphery defined by outer edge faces shaped and sized to fit conformably within the rectangular sidewalls of the cavity and a flat bottom for pressing margins of the segment of flexible film strip against the flat bottom face of the carrier body member;

complementary interengagement means spaced along the interior periphery of the cavity in the body member and the exterior periphery of the retainer member for interlocking the retainer member within the body member in nested relationship with a margin of the segment of flexible film strip sandwiched between said members;

the film strip segment having a first rectangular length and width;

the opening in the carrier body member being sized to a second rectangular length and width each less than the first length and width, respectively, by a predetermined margin;

the retainer member including a window centrally located therein exposing a central portion of an upper side of the segment of film strip opposite the opening in the body member;

the window being sized to a third rectangular length and width each less than the first length and width, respectively, and greater than the second length and width, respectively, for exposing a portion of said beam leads supported atop the bottom wall; and a marginal area of the segment having contact pads formed thereon in a location such that the pads are supported from the underside by the bottom wall of the carrier body member and exposed within the window of the retainer member for contact by test probes.

36. An assembly according to claim 35, in which the film strip segment has a predetermined rectangular length and width, the cavity and retainer member being sized to a length and width that exceed the length and width, respectively, of the segment by a predetermined distance such that the retainer member resiliently compresses the margin of the segment when interlocked within the body member.

* * * * *

UNITED STATES PATENT AND TRADEMARK OFFICE
CERTIFICATE OF CORRECTION

PATENT NO. : 4,949,159

DATED : August 14, 1990

INVENTOR(S) : Chester H. Petry, Jr. and Jon C. Houghton

It is certified that error appears in the above-identified patent and that said Letters Patent is hereby corrected as shown below:

Column 9, line 68, change "member is" to --member in--;

Column 12, line 14, change "claim 17," to --claim 23,--;

Column 13, line 30, change "claim 11 in" to --claim 17 in--.

Signed and Sealed this

Fifth Day of March, 1991

Attest:

HARRY F. MANBECK, JR.

*Attesting Officer*     *Commissioner of Patents and Trademarks*